(12) United States Patent
Spears et al.

(10) Patent No.: US 6,356,150 B1
(45) Date of Patent: Mar. 12, 2002

(54) PORTABLE INTEGRATED SWITCHING POWER AMPLIFIER

(75) Inventors: Edward T. Spears, Chandler, AZ (US); Jon D. Jorgenson, Greensboro, NC (US); Victor E. Steel, Oak Ridge, NC (US); Khoi Tam Vu, Jamestown, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 09/488,766

(22) Filed: Jan. 21, 2000

(51) Int. Cl.⁷ .................................................. H03G 3/20
(52) U.S. Cl. ........................................ 330/145; 330/284
(58) Field of Search .......................... 330/51, 144, 145, 330/284, 302

(56) References Cited

U.S. PATENT DOCUMENTS

| | | | |
|---|---|---|---|
| 3,942,181 A | * 3/1976 | Berrod et al. ........... 330/145 X |
| 4,158,819 A | 6/1979 | Smither ........................ 330/9 |
| 4,673,886 A | * 6/1987 | Bickley et al. ......... 330/145 X |
| 4,743,863 A | * 5/1988 | Cassany et al. ............. 330/284 |
| 4,910,478 A | * 3/1990 | Koyama ................... 330/51 X |
| 5,604,460 A | 2/1997 | Sehrig et al. ................. 330/51 |
| 5,661,434 A | 8/1997 | Brozovich et al. ............ 330/51 |
| 5,758,269 A | 5/1998 | Wu ............................ 455/127 |
| 5,831,477 A | 11/1998 | Tsumura ...................... 330/51 |
| 5,834,975 A | 11/1998 | Bartlett et al. .............. 330/278 |

\* cited by examiner

*Primary Examiner*—Steven J. Mottola
(74) *Attorney, Agent, or Firm*—Withrow & Terranova, P.L.L.C.

(57) ABSTRACT

A high efficiency multiple power level power amplifier has a PIN diode network that selectively associates an impedance transformation network with an interstage impedance matching network to maintain desired gain and linearity characteristics for the power amplifier at different output power levels. The PIN diode network in the off mode (high power), has a high breakdown voltage and high series resistance thereby reducing distortion components. The PIN diode network in the on mode (low power), has a low series resistance thereby reducing insertion losses.

21 Claims, 2 Drawing Sheets

PORTABLE INTEGRATED SWITCHING POWER AMPLIFIER

BACKGROUND OF THE INVENTION

(1) Field of the Invention

The present invention relates generally to radio frequency (RF) power amplifiers and, more particularly, to a multiple power level amplifier circuit for maintaining high efficiency.

(2) Description of the Prior Art

The need for radio receivers continues to be widespread as recently evidenced by the phenomenal growth associated with use of cellular telephones. Cellular telephones have continued and will continue to undergo dramatic market growth. One recent trend in the cellular telephone industry is toward use of multiple power level amplifiers to accommodate code division multiple access (CDMA) systems in portable handheld units. Known techniques for achieving high efficiencies at multiple output power levels associated with such power amplifiers have generally required multiple switches and/or control logic, or have otherwise required multiple output amplifier stages combined to vary the saturated amplifier output power. These techniques are disadvantageous in that they require large die sizes, therefore increasing associated die costs. The aforesaid increased die costs are competitively prohibitive for manufacturing the aforesaid portable handheld units in high volumes.

One multiple power level amplifier for accommodating multiple power amplifier output power levels is disclosed in U.S. Pat. No. 5,661,434, issued Aug. 26, 1997 to Brozovich et al., and entitled High Efficiency Multiple Power Level Amplifier Circuit. Brozovich et al. disclose a high efficiency multiple power level amplifier circuit for reducing power consumption during low power operations. A plurality of power amplifier stages are cascaded to provide multiple levels of amplification. At least one power amplifier stage includes a signal switching network to allow one or any combination of power amplifiers to be switched out when lower power operations are desired. The switched out power amplifiers are biased such that substantially no current is drawn form the power source. A disadvantage of the foregoing approach to dealing with multiple power levels is associated with the inherent necessity to increase the die size required to accommodate the multiple switches as well as the additional signal switching network.

In view of the above, a portable integrated switching power amplifier that is suitable for use with CDMA systems and that uses a single switching device to accommodate multiple power levels with no substantial efficiency loss is desirable. Such an architecture offers simplicity of design and will generally occupy less area on an integrated circuit than a similar power amplifier architecture that uses switching devices and associated control logic presently familiar to those skilled in the art of CDMA systems for power amplifiers in portable units.

SUMMARY OF THE INVENTION

The present invention is directed to a power amplifier architecture suitable for use with CDMA systems in portable units such as cellular telephones and the like. Such power amplifiers must be capable of selectively varying output power between 3 dB below saturation and 50 dB below the specified output power level. It is well known that power amplifier efficiency degrades rapidly as the output power level is lowered away from saturation by the ratio of $Pout/Pout_{max}$.

One preferred embodiment of the present invention utilizes a pair of PIN diodes implemented with GaAs heterojunction bipolar transistor (HBT) technology in a fully integrated GaAs HBT amplifier. The PIN diodes are used to implement a compact bypass switching network such that a power amplifier output stage can be selectively switched into and out of the GaAs HBT amplifier circuit. The PIN diodes have a high breakdown voltage level in the off mode (high amplifier output power mode), thereby reducing any distortion components normally associated with more conventional switching devices or circuit elements. The PIN diodes have a low series on resistance in the on mode (low amplifier output power mode), thereby reducing any insertion loss normally associated with the more conventional switching devices or circuit elements.

The present invention then, is directed to a PIN diode compact bypass switching network for selectively switching one or more stages of a power amplifier into or out of the amplifier circuit. One preferred embodiment allows an output amplifier transistor collector current to be reused when the PIN diode switching network functions in the low power on mode (bypass mode). The PIN diode switching network has a high series resistance in the high power mode compared to either the output impedance of the amplifier input stage(s) or the input impedance of the output amplifier transistor(s). This feature ensures highly efficient power transfer from the input stage(s) to the output stage(s) in the high power mode. A preferred embodiment utilizes an inverter circuit in the low power mode to both switch off the output stage(s) and switch on the PIN diodes. A low output impedance is presented to the input stage(s) in the low power mode, allowing higher saturated output power then that achievable when matching the output of the input stage(s) to the input of the output stage(s). Known circuit architectures require each amplifier stage to be matched to 50 ohms with a switch between each device and a third bypass switch. Such known architectures suffer undesirable losses from the matching networks and switches.

Accordingly, one feature of the present invention includes provision of a portable integrated switching power amplifier architecture capable of performing both low power and high power amplification with no substantial degradation in power amplifier efficiency.

Another feature of the present invention includes provision of a portable integrated switching power amplifier architecture that is integrated on a single integrated circuit chip, and that is useable in a cellular telephone suitable for use with CDMA systems.

These and other features of the present invention will become apparent to those skilled in the art after a reading of the following description of the preferred embodiment when considered with the drawings.

DESCRIPTION OF THE PREFERRED EMBODIMENTS

Figure 1:
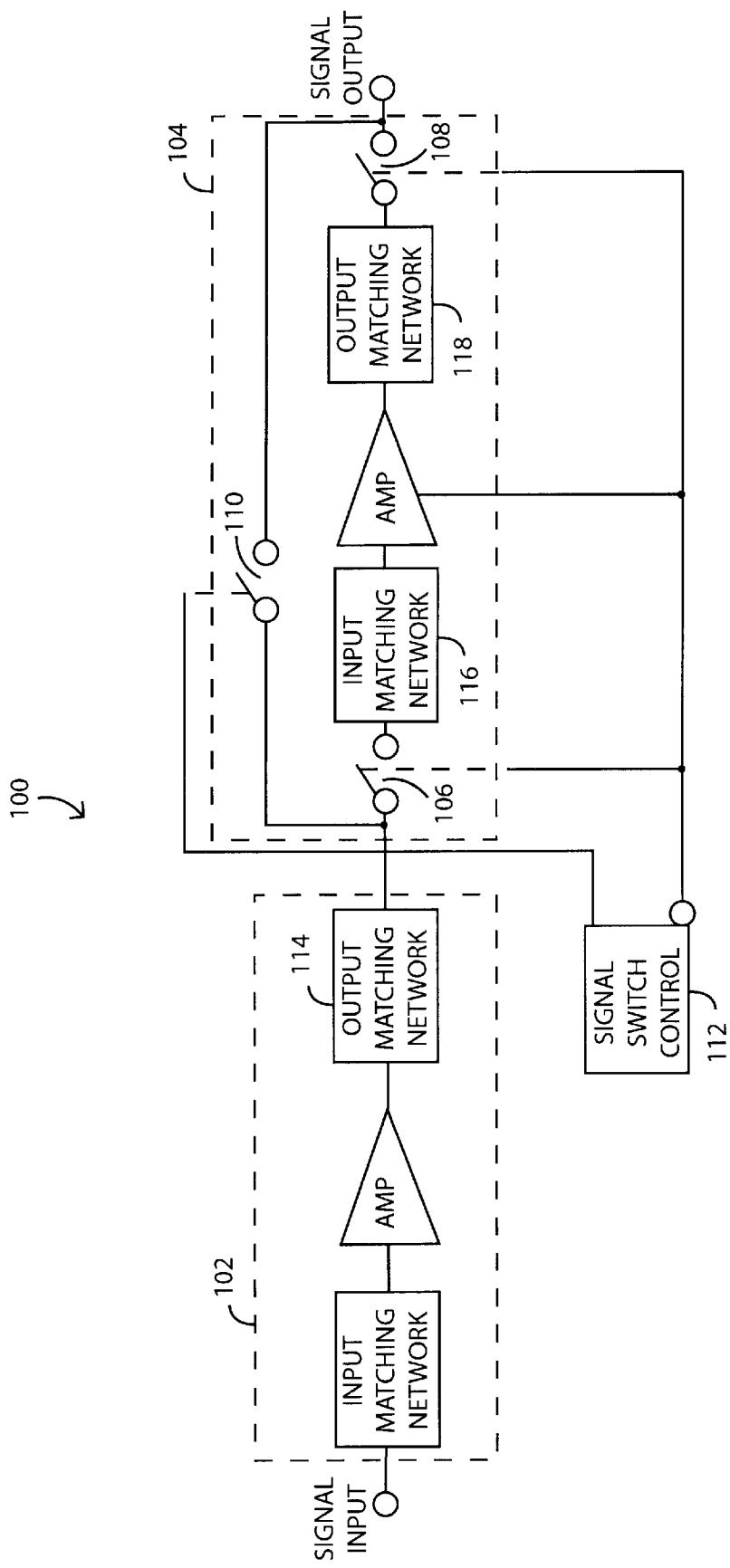
FIG. 1 is a simplified schematic diagram illustrating a high efficiency multiple power level amplifier circuit known in the prior art.

In the following descriptions, like reference characters designate like or corresponding parts throughout the several views. Referring now to the drawings in general and FIG. 1 in particular, it will be understood that the illustrations are for the purpose of describing a preferred embodiment of the invention and are not intended to limit the invention thereto. As shown in FIG. 1, a simplified schematic diagram illustrates one high efficiency multiple power level amplifier circuit 100 known in the art. The amplifier circuit 100 includes an input stage 102 and an output stage 104. A high power mode is achieved by closing an interstage coupling switch 106 and an output stage switch 108 that couples the output from the output stage 104 to an antenna or other desired device. A low power mode is achieved by closing an output stage shorting switch 110 and simultaneously opening the coupling switch 106 and the output stage switch 108. The shorting switch 110 couples the output from the input stage 102 to an antenna or other desired device. Opening the coupling switch 106 and the output stage switch 108 removes the output amplifier stage 104 from the amplifier circuit 100 to achieve a low power mode. The above described switching operations allow the amplifier circuit 100 to operate in either a low power mode or a high power mode without any substantial degradation in amplifier efficiency. A switch control network 112 is used to selectively control operation of the switches 106, 108, 110. While the high efficiency multiple power level amplifier circuit 100 is capable of maintaining high efficiency levels at multiple power levels, it does so at the expense of increased die sizes when constructed using integrated circuit technology necessary to accommodate portable handheld units such as cellular telephones and the like. Further, the use of switches 106, 108, 110 and associated switch control network 112 actually contribute additional losses associated with the matching networks 114, 116, 118. These additional losses then reduce the overall operating efficiency of the amplifier circuit 100.

Figure 2:
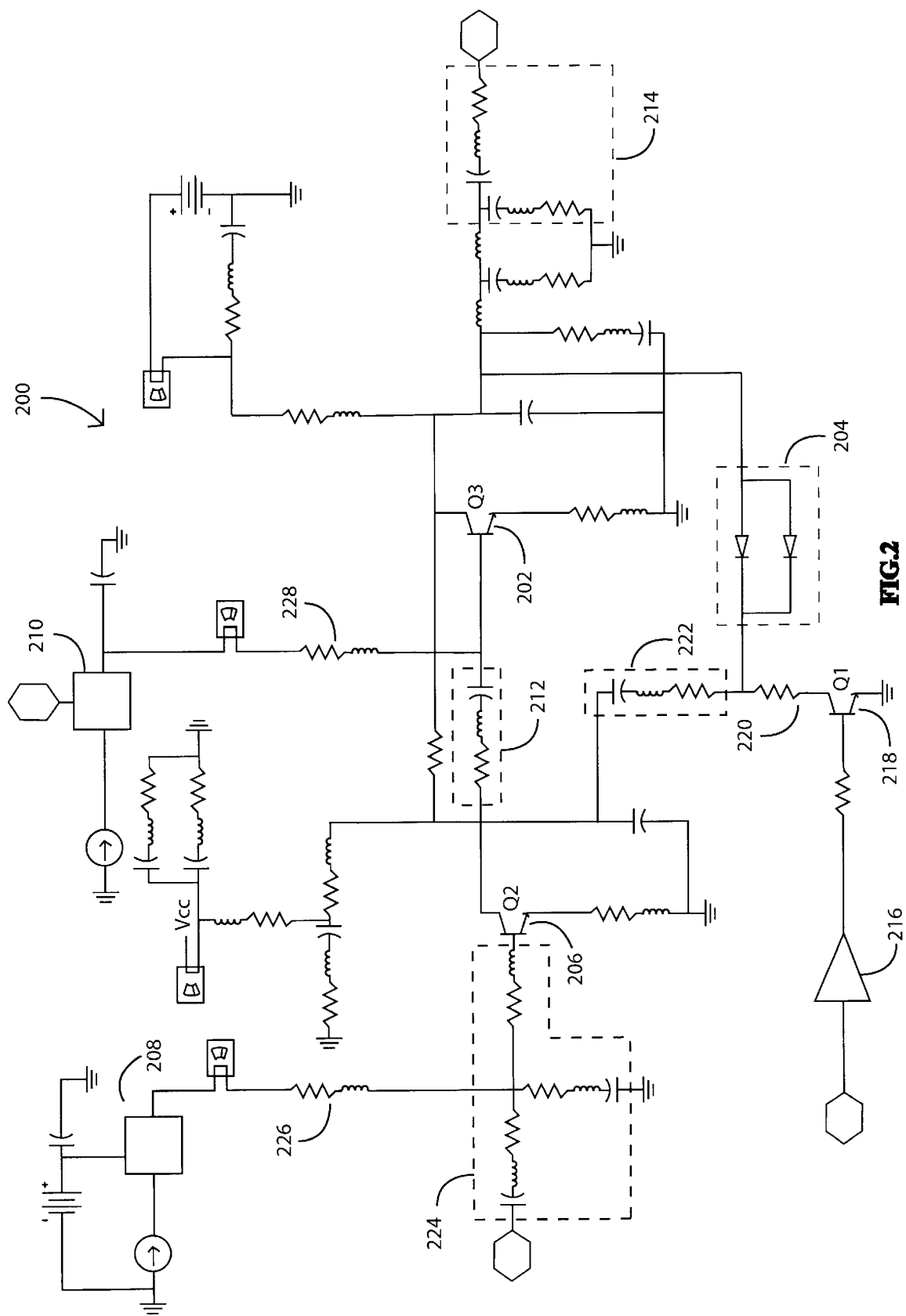
FIG. 2 is a simplified schematic diagram illustrating one preferred embodiment of a portable integrated switching power amplifier in accordance with the present invention and that is capable of operation at multiple output power levels.

FIG. 2 is a simplified schematic diagram illustrating one preferred embodiment of a portable integrated switching power amplifier 200 in accordance with the present invention and that is capable of operation at multiple output power levels. The power amplifier 200 does not use input and output switches or bypass switches with conventional switching control networks to control which amplifier stages are operational to accommodate different power levels. Rather, the power amplifier 200 simply biases an output amplifier stage transistor 202 on or off in combination with activating a novel current feedback circuit including one or more PIN diodes 204 to accommodate different power levels. This approach to providing high efficiency multiple power levels from a single power amplifier allows formation of an integrated circuit structure having minimal die sizes conducive to high volume production of high efficiency power amplifiers for use in association with CDMA systems and associated portable cellular telephones and the like.

CDMA systems associated with power amplifiers in portable units present challenges in that such systems require that output power levels be variable between 3 dB below amplifier saturation levels and 50 dB below specified output power levels. Modem probability spectrum data demonstrates that output power levels are on average between −5 and 5 dBm. The present invention provides a portable integrated switching power amplifier 200 that meets the requisite criteria associated with CDMA system power amplifiers suitable for use in cellular telephones or other like portable units.

The portable integrated switching power amplifier 200 includes an output stage transistor 202 and an input stage transistor 206. A current feedback circuit includes a pair of PIN diodes 204 that are configured to share PIN diode 204 current drain with the collector of output stage transistor 202. A pair of cascoded current mirror bias circuits 208, 210 provides biasing for the input and output amplifier stage transistors 206, 202 respectively. During high power operation, the output stage transistor 202 is biased on by bias circuit 210 and the PIN diodes 204 are not activated (turned on). Since the PIN diodes 204 have a high breakdown voltage level and a large series impedance when they are not turned on, they do not cause any distortion products to the portable integrated switching power amplifier 200 during its high power output mode. When the power amplifier 200 is in its high power mode, the output impedance presented by the input stage transistor 206 is adjusted to 15 ohms via the interstage matching network 212 between the input stage transistor 206 collector and the output stage transistor 202 base. The 15 ohm impedance is selected to maintain the gain and linearity of the input stage transistor 206 during the high power output mode. A two section low-pass matching network 214 matches the power amplifier output stage transistor 202 to a 50 ohm load to achieve the maximum power output level.

An inverter network is used to switch the power amplifier 200 into its low power mode. The inverter network includes a switching transistor 218 that is selectively biased on or off via an inverter 216 to activate or deactivate the PIN diodes 204 respectively. The inverter input signal is also used to turn off the output stage transistor 202 simultaneously with activation of the switching transistor 218. During activation of the switching transistor 218, the base-emitter voltage (Vbe voltage) for the output stage transistor 202 is set to 0 volts, thereby switching off the output stage transistor 202. When the switching transistor 218 is turned on, current flows through the PIN diodes 204 via resistor 220 and to ground through the switching transistor 218, thereby causing the PIN diodes 204 into a low impedance state. The PIN diode 204 current drain is shared with the collector of the output stage transistor 202, thereby preserving the external pin count associated with portable integrated switching power amplifier 200. As stated above, the power amplifier 200 enters its low power mode when the PIN diodes 204 are turned on. During this low power mode, an impedance transformation network 222 is switched into its operational state via resistor 220 and switching transistor 218. The impedance transformation network 222 adjusts the AC load line of the power amplifier 200 from the above described 15 ohms to a new level of 25 ohms to maintain the gain and linearity of the input stage transistor 206 which now also is transformed into an output stage transistor to accommodate the low power mode.

With continued reference to FIG. 2, the power amplifier 200 can also be seen to include a conventional input matching network 224 as well as a ballast feed resistor 226, 228 associated with the input stage transistor 206 and the output stage transistor 202 respectively. These ballast feed resistors 226, 228 guard against thermal runaway conditions that are familiar to those skilled in the art of HBT devices. The use of such matching networks and ballast resistors is well known in the art.

Most preferably, the power amplifier is implemented with GaAs HBT technology to formulate a fully integrated switching power amplifier having very low current drain characteristics suitable for use in portable products such as cellular telephones and the like. As stated above, the PIN diodes 204 have a very high breakdown voltage therefore reducing introduction of distortion components in the high power output mode. In the low power output mode, the low series on resistance of the PIN diodes 204 reduces insertion loss generally associated with more conventional switches and switching devices. The power amplifier 200 structure illustrated in FIG. 2 can be seen to allow reuse of the input stage transistor 206 collector current when the PIN diodes 204 are activated to put the power amplifier 200 in its low output power mode. In the high power mode for one preferred embodiment of the power amplifier 200, the PIN diodes 204 have a high series resistance compared with either the output impedance (15 ohms) of the switching transistor 218 or the input impedance (1.8 ohms) of the input stage transistor 206. This feature ensures a highly efficient power transfer from the input stage transistor 206 to the output stage transistor 202 when the power amplifier 200 is switched into its high output power mode. In the low power mode for one preferred embodiment of the power amplifier 200, the output impedance presented to the switching transistor 218 is 4 ohms, allowing a higher saturated output power (higher efficiency) then that obtainable when matched to the output of the input stage transistor 206. Those skilled in the art can appreciate that known solutions to providing high efficiency multiple power level amplifiers generally require that each amplifier stage be matched to 50 ohms with a switch between each stage and a bypass switch as discussed above.

Certain modifications and improvements will occur to those skilled in the art upon a reading of the foregoing description. By way of example, just as the inventive embodiments disclosed herein describe specific power amplifier architectures using embodiments of the present invention, different power amplifier architectures using the present inventive principles are possible with superior performance over classic multiple power level amplifier architectures known in the art. For example, the present invention could be implemented using higher order filters and numerous other types of matching networks as well as a greater number of amplifier stages in association with numerous embodiments directed to the present inventive principles using PIN diode networks. The present invention can also be implemented using semiconductor fabrication technologies other than those associated with GaAs HBT technologies. Further, the present invention can be constructed using various combinations of the aforesaid elements, so long as the requisite power transfer characteristics are maintained between the input stage(s) and the output stage(s) using the present inventive PIN diode principles. It should be understood that all such modifications and improvements have been deleted herein for the sake of conciseness and readability but are properly within the scope of the following claims.

We claim:

1. A high efficiency multiple power level power amplifier comprising:
    at least one input amplifier stage configured to generate a first output signal from a first input signal;
    at least one output amplifier stage configured to receive the first output signal and generate a second output signal therefrom;
    a PIN diode network in electrical communication with the at least one output and at least one input amplifier stages and configured to transform an interstage impedance between the at least one input amplifier stage and the at least one output amplifier stage in response to a second input signal; and
    an inverter network in electrical communication with the PIN diode network and configured to generate the second input signal to selectively enable and disable the PIN diode network such that the PIN diode network is capable of controlling the interstage impedance between the at least one input and the at least one output amplifier stages to establish a desired AC load line for the high efficiency multiple power level power amplifier.

2. The high efficiency multiple power level power amplifier according to claim 1 wherein the inverter network comprises a GaAs heterojunction bipolar transistor.

3. A high efficiency multiple power level power amplifier comprising:
    at least one input amplifier stage configured to generate a first output signal from a first input signal;
    at least one output amplifier stage configured to receive the first output signal and generate a second output signal therefrom; and
    a PIN diode network in electrical communication with the at least one output and at least one input amplifier stages and configured to transform an interstage impedance between the at least one input amplifier stage and the at least one output amplifier stage in response to a second input signal,
wherein the at least one output amplifier stage is responsive to the second input signal such that the at least one output amplifier stage can be selectively turned on and off to vary the output power level of the high efficiency multiple power level power amplifier.

4. A high efficiency multiple power level power amplifier comprising:
    at least one input amplifier stage configured to generate a first output signal from a first input signal;
    at least one output amplifier stage configured to receive the first output signal and generate a second output signal therefrom;
    a PIN diode network in electrical communication with the at least one output and at least one input amplifier stages and configured to transform an interstage impedance between the at least one input amplifier stage and the at least one output amplifier stage in response to a second input signal; and
    a plurality of impedance transformation networks in electrical communication with the PIN diode network such that the plurality of impedance transformation networks can achieve a first impedance level when the PIN diode network is enabled and further such that the plurality of impedance transformation networks can achieve a second impedance level when the PIN diode network is disabled, wherein the first and second impedance levels are capable of maintaining a desired gain and linearity characteristic at each output power level for the high efficiency multiple power level power amplifier.

5. The high efficiency multiple power level power amplifier according to claim 4 wherein the at least one input amplifier stage comprises a GaAs heterojunction bipolar transistor.

6. The high efficiency multiple power level power amplifier according to claim 5 wherein the at least one output amplifier stage comprises a GaAs heterojunction bipolar transistor.

7. A high efficiency multiple power level power amplifier comprising:
    at least one input amplifier stage configured to generate a first output signal from a first input signal;
    at least one output amplifier stage configured to receive the first output signal and generate a second output signal therefrom; and a PIN diode network in electrical communication with the at least one output and at least one input amplifier stages and configured to transform an interstage impedance between the at least one input amplifier stage and the at least one output amplifier stage in response to a second input signal, wherein the PIN diode network is configured to be integrated with a GaAs HBT integrated circuit.

8. A high efficiency multiple power level power amplifier comprising:
   a first amplifier transistor configured to generate a first amplified signal from a first input signal;
   an impedance matching network in electrical communication with the first amplifier transistor and configured to receive the first amplified signal and generate a processed signal therefrom;
   a second amplifier transistor in electrical communication with the impedance matching network and configured to receive the processed signal and generate a second amplified signal;
   an impedance transformation network coupled to the impedance matching network;
   a PIN diode network in electrical communication with the second amplifier transistor and the impedance transformation network; and
   an inverter network in electrical communication with the PIN diode network and configured to disable the PIN diode network such that the impedance transformation network is capable of varying the impedance characteristics of the impedance matching network to establish a first impedance level and further configured to enable the PIN diode network such that the impedance transformation network is capable of varying the impedance characteristics of the impedance matching network to establish a second impedance level.

9. The high efficiency multiple power level power amplifier according to claim 8 wherein the matching network is further configured to maintain a desired gain and linearity characteristic at a first power amplifier output power level.

10. The high efficiency multiple power level power amplifier according to claim 9 wherein the impedance matching network and the impedance transformation network are configured to yield a combined matching impedance sufficient to maintain a desired gain and linearity characteristic at a second power amplifier output power level.

11. The high efficiency multiple power level power amplifier according to claim 8 wherein the inverter network is further configured to disable the second amplifier transistor simultaneously with the enablement of the PIN diode network.

12. It A high efficiency multiple power level power amplifier comprising:
   means for preamplifying a first input signal to produce a first output signal;
   means for amplifying the first output signal to produce an amplified output signal;
   means for matching an output impedance of the preamplifying means to an input impedance of the amplifying means;
   means for transforming an impedance associated with the impedance matching means; and
   a PIN diode network configured to selectively enable and disable the transforming means to maintain a desired gain and linearity characteristic at a plurality of output power levels for the high efficiency multiple power level power amplifier.

13. The high efficiency multiple power level power amplifier according to claim 12 wherein the preamplifying means, amplifying means, matching means, transforming means and PIN diode network are configured to form a portable integrated GaAs HBT switching power amplifier.

14. A high efficiency multiple power level power amplifier comprising:
   a first GaAs HBT having a base, a collector and an emitter;
   a second GaAs HBT having a base, a collector and an emitter;
   an interstage impedance matching network having an input coupled to the collector of the first GaAs HBT and having an output coupled to the base of the second GaAs HBT;
   a ground point;
   a third GaAs HBT having a base, a collector and an emitter, the emitter of the third GaAs HBT being coupled to the ground point;
   a resistor having a first end and a second end, the first end being coupled to the collector of the third GaAs HBT;
   a PIN diode network having an input coupled to the collector of the second GaAs HBT and having an output electrically coupled to the second end of the resistor; and
   an impedance transformation network having an input coupled to the input of the interstage impedance matching network and further having an output coupled to the output of the PIN diode network.

15. The high efficiency multiple power level power amplifier according to claim 14 further comprising an input stage impedance matching network having a signal input node, a ground node, an output node and a bias node, wherein the output node is coupled to the base of the first GaAs HBT.

16. The high efficiency multiple power level power amplifier according to claim 15 further comprising a first cascoded current mirror bias network coupled to the bias node of the input stage impedance matching network.

17. The high efficiency multiple power level power amplifier according to claim 16 further comprising a second cascoded current mirror bias network coupled to the base of the second GaAs HBT.

18. The high efficiency multiple power level power amplifier according to claim 17 further comprising an output stage impedance matching network having a signal input and a signal output, wherein the signal input is coupled to the collector of the second GaAs HBT.

19. The high efficiency multiple power level power amplifier according to claim 14 wherein the third GaAs HBT is configured to selectively enable and disable the PIN diode network such that a first impedance level can be set for the interstage impedance matching network when the PIN diode network is disabled and further such that the impedance transformation network can interact with the interstage impedance matching network when the PIN diode network is enabled to set a second impedance level for the interstage matching network.

20. A method of maintaining RF power amplifier efficiency at multiple output power levels comprising the steps of:
   providing a multistage RF power amplifier having an impedance matching network between each amplifier stage, at least one impedance transformation network, and a PIN diode switching network in electrical communication with the at least one impedance transformation network; and activating the PIN diode switching network to enable operation of the at least one impedance transformation network within the multistage RF power amplifier such that the at least one impedance transformation impedance network can modify at least one interstage impedance matching network thereby rendering the multistage RF power amplifier capable of generating an output signal having a power level that is limited by the matching network between each amplifier stage in combination with the at least one impedance transformation network.

21. The method of claim 20 further comprising the step of inactivating the PIN diode switching network to disengage the at least one impedance transformation network from the multistage RF power amplifier such that the multistage RF power amplifier is capable of generating an output signal having a power level that is limited by the matching network between each amplifier stage.

* * * * *